(12) United States Patent
Kobayashi et al.

(10) Patent No.: US 7,875,322 B2
(45) Date of Patent: Jan. 25, 2011

(54) PLASMA PROCESSING METHOD

(75) Inventors: Takashi Kobayashi, Amagasaki (JP);
Shingo Furui, Higashiosaka (JP);
Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 614 days.

(21) Appl. No.: 11/794,894

(22) PCT Filed: Jan. 5, 2006

(86) PCT No.: PCT/JP2006/300025
§ 371 (c)(1),
(2), (4) Date: Oct. 11, 2007

(87) PCT Pub. No.: WO2006/073152
PCT Pub. Date: Jul. 13, 2006

(65) Prior Publication Data
US 2009/0035484 A1    Feb. 5, 2009

(30) Foreign Application Priority Data
Jan. 7, 2005    (JP) .............................. 2005-002417

(51) Int. Cl.
*C23C 16/511* (2006.01)
(52) U.S. Cl. ..................... 427/575; 427/569
(58) Field of Classification Search ................... None
See application file for complete search history.

(56) References Cited

U.S. PATENT DOCUMENTS
2003/0142198 A1 *   7/2003   Miyake ..................... 347/246
2006/0110934 A1 *   5/2006   Fukuchi ..................... 438/778
2006/0156984 A1      7/2006   Nozawa et al.

FOREIGN PATENT DOCUMENTS

| EP | 1632994 A1 * | 3/2006 |
| JP | 62 76726 | 4/1987 |
| JP | 03158470 A * | 7/1991 |
| JP | 9 185999 | 7/1997 |
| WO | 02 058130 | 7/2002 |
| WO | WO 2004/107430 A1 | 12/2004 |

OTHER PUBLICATIONS

Englsih Abstract of JP0315870A, Tamahashi.*

* cited by examiner

*Primary Examiner*—Timothy H Meeks
*Assistant Examiner*—Joseph Miller, Jr.
(74) *Attorney, Agent, or Firm*—Oblon, Spivak, McClelland, Maier & Neustadt, L.L.P.

(57) ABSTRACT

Pulsated microwaves are supplied to a wave guide tube from a microwave generation unit through a matching circuit. The microwaves are supplied through an inner conductor to a planar antenna member. The microwaves are radiated from the planar antenna member through a microwave transmission plate into space above a wafer within a chamber. An electromagnetic field is formed in the chamber by pulsated microwaves radiated into the chamber from the planar antenna member through the microwave transmission plate, turning an Ar gas, $H_2$ gas and $O_2$ gas into plasma to form an oxide film on the wafer.

14 Claims, 9 Drawing Sheets

PLASMA PROCESSING METHOD

TECHNICAL FIELD

The present invention relates to a plasma processing method for performing a process, such as formation of an oxide film, on a target object, such as a semiconductor substrate, by use of plasma.

BACKGROUND ART

In the process of manufacturing various kinds of semiconductor devices, a silicon oxide film is frequently formed for the purpose of forming an insulating film or the like. Because a silicon oxide film is very stable and serves as a protective film against outside, the film formation technique takes an important position essential in the manufacturing of semiconductor devices. Particularly, micropatterning of semiconductor devices has recently advanced, requiring a technique of accurately forming a thin silicon oxide film of a good quality which has a thickness of several nm or so.

Formation of an oxide film on a silicon surface has often used thermal oxidation so far. However, thermal oxidation which is executed at a high temperature has a problem of causing damage, such as re-diffusion of a doping impurity, due to a heat process.

As a technique of forming a silicon oxide film in a plasma process, there has been proposed a method of forming an $SiO_2$ film on the surface of a target substrate essentially containing Si, using plasma based on microwave radiation via an planar antenna member having a plurality of slits at the presence of a process gas containing at least an $O_2$ gas and a rare gas (for example, Patent Document 1).

[Patent Document 1]
International Publication No. WO2002/058130

DISCLOSURE OF INVENTION

In the case of forming a silicon oxide film using plasma, low-temperature film formation is possible, thereby overcoming a lot of thermal-oxidation originated problems. However, in this case, a so-called plasma damage is caused as a plasma inherent problem, which affects semiconductor wafers due to the action of active species contained in the plasma. Particularly, in the case of forming an oxide film using gas plasma containing hydrogen and oxygen, the plasma causes intense light-emission in the ultraviolet region due to OH radicals, which may degrade the quality of the formed oxide film. However, if the light-emission in the ultraviolet region in plasma is suppressed, the oxidation action is weakened, thereby decreasing the oxidation rate.

Accordingly, an object of the present invention is to provide a plasma processing method which can perform a process with a suppressed plasma damage by controlling light-emission in the ultraviolet region, and, preferably a plasma processing method capable of forming an oxide film at a sufficient oxidation rate.

The present inventors have arrived at the present invention through intensive studies to solve the problems, during which the present inventors have discovered that the use of pulsated electromagnetic waves can ensure a plasma process with a reduced plasma damage on a target object while suppressing light-emission of plasma, and can form an oxide film at an oxidation rate practically sufficient particularly in a plasma oxidization.

According to a first aspect of the present invention, there is provided a plasma processing method comprising forming a silicon oxide film by oxidizing silicon by action of plasma on a target object in a process chamber of a plasma processing apparatus, while generating the plasma by pulsated electromagnetic waves.

In the first aspect described above, the electromagnetic waves are preferably microwaves.

It is preferable that a pulse condition is controlled such that a light-emission intensity of plasma formed by the pulsated electromagnetic waves in an ultraviolet region is equal to or lower than 50% of a light-emission intensity of plasma formed by continuous electromagnetic waves in the ultraviolet region, and an oxidation rate of the plasma by the pulsated electromagnetic waves is equal to or higher than 55% of an oxidation rate of the plasma by the continuous electromagnetic waves. In this case, a process gas containing a rare gas, oxygen, and hydrogen is preferably used.

Light-emission in the ultraviolet region is preferably light-emission caused by OH radicals.

It is preferable that a pulse condition is controlled such that a light-emission intensity of plasma formed by the pulsated electromagnetic waves in an ultraviolet region is equal to or lower than 90% of a light-emission intensity of plasma formed by continuous electromagnetic waves in the ultraviolet region, and an oxidation rate of the plasma by the pulsated electromagnetic waves is equal to or higher than 80% of an oxidation rate of the plasma by the continuous electromagnetic waves. In this case, a process gas containing a rare gas and oxygen is preferably used.

It is preferable that a frequency of the pulse should be 1 to 100 kHz, and a duty ratio should be 10 to 90%, and further that a frequency of the pulse should be 5 to 50 kHz, and a duty ratio should be 50 to 90%.

A process pressure is preferably 66.7 to 266.6 Pa.

According to a second aspect of the present invention, there is provided a plasma processing method comprising forming a silicon oxide film by oxidizing silicon by action of plasma on a target object in a process chamber of a plasma processing apparatus, while supplying pulsated electromagnetic waves into the process chamber to generate plasma, measuring a light-emission intensity of the plasma in the process chamber, and controlling the light-emission intensity by changing a pulse condition according to a measured value of the light-emission intensity.

According to a third aspect of the present invention, there is provided a plasma processing method comprising processing a target object by action of plasma thereon in a process chamber of a plasma processing apparatus, while supplying pulsated electromagnetic waves into the process chamber to generate plasma, and controlling a light-emission intensity of the plasma in the process chamber by a pulse condition.

In the third aspect described above, it is preferable that the light-emission intensity of the plasma in the process chamber is measured, and controlled by changing a pulse condition according to a measured value of the light-emission intensity. Further, light-emission of the plasma is preferably light-emission in an ultraviolet region.

In the first to third aspects described above, the plasma processing apparatus preferably includes a planar antenna having a plurality of slots to supply microwaves into the process chamber.

According to a fourth aspect of the present invention, there is provided a plasma processing apparatus comprising:
a plasma source that generates plasma with pulsated electromagnetic waves;
a process container that defines a process chamber to perform a film formation process on a target object with the plasma;

a support on which the target object is placed in the process container;

an exhaust mechanism for reducing pressure inside the process container;

a gas supply mechanism for supplying a gas into the process container; and a control section that controls the process container to perform a plasma processing method comprising forming a silicon oxide film by oxidizing silicon by action of plasma on the target object in the process container, while generating the plasma by pulsated electromagnetic waves.

According to a fifth aspect of the present invention, there is provided a control program which is executed on a computer, and, when executed, controls a process chamber of a plasma processing apparatus to perform a plasma processing method comprising forming a silicon oxide film by oxidizing silicon by action of plasma on a target object in a process chamber of a plasma processing apparatus, while generating the plasma by pulsated electromagnetic waves.

According to a sixth aspect of the present invention, there is provided computer readable storage medium storing a control program which is executed on a computer, wherein the control program, when executed, controls a process chamber of a plasma processing apparatus to perform a plasma processing method comprising forming a silicon oxide film by oxidizing silicon by action of plasma on a target object in a process chamber of a plasma processing apparatus, while generating the plasma by pulsated electromagnetic waves.

Because light-emission of plasma in the ultraviolet region can be suppressed significantly by performing a process, such as formation of a silicon oxide film, by use of plasma produced by pulsated electromagnetic waves, it is possible to provide a reliable plasma processing apparatus which reduces an ultraviolet-ray originated plasma damage, thereby improving the yield of articles.

Further, in the plasma oxidization process, selecting the pulse condition can form an oxide film of a good quality while keeping an oxidation rate close to that of plasma produced by continuous electromagnetic waves.

Because the intensity of light-emission in the ultraviolet region of plasma can be controlled by changing the pulse condition during the plasma process, a process with fewer plasma damages becomes possible.

BEST MODE FOR CARRYING OUT THE INVENTION

Figure 1:
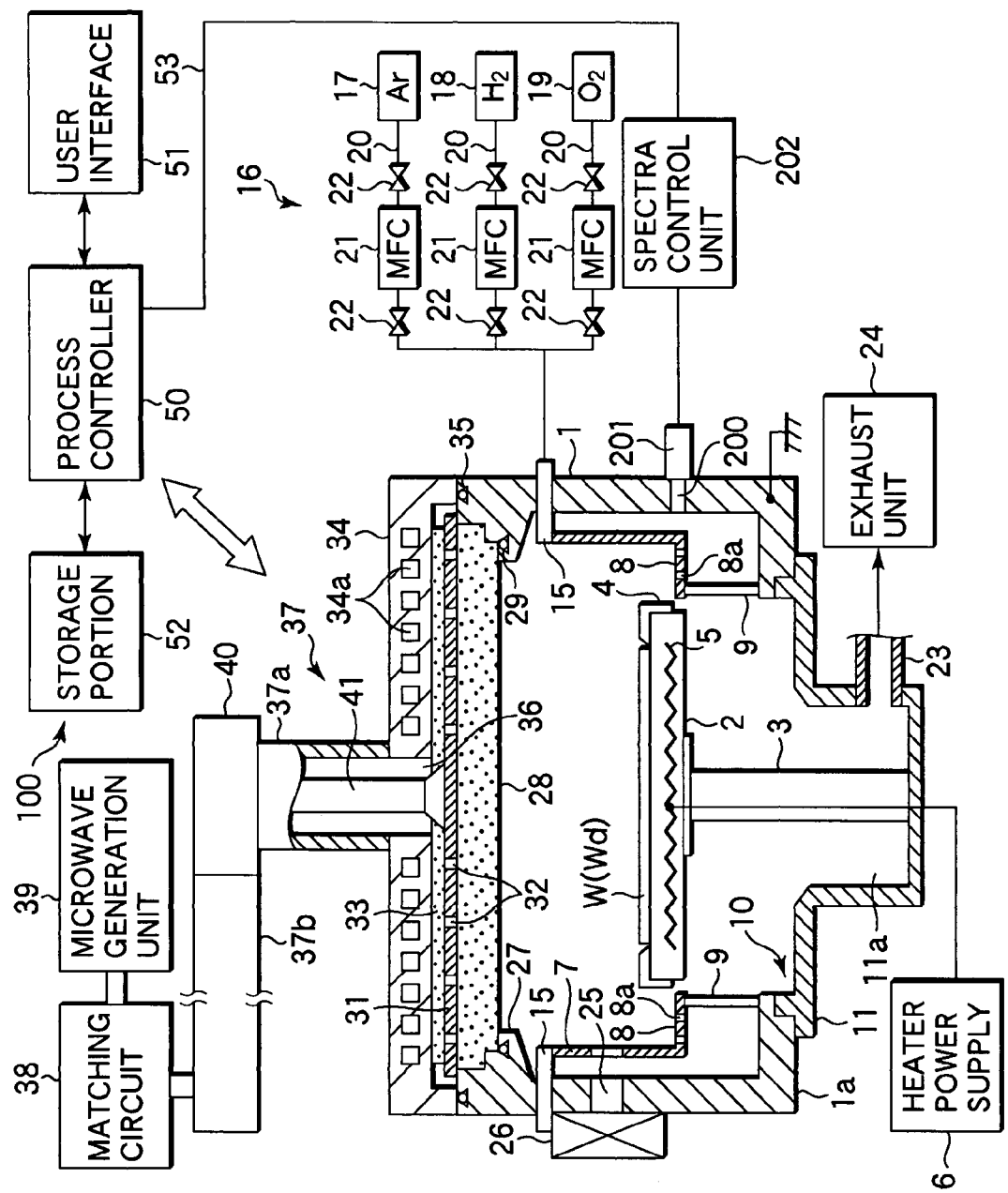
FIG. 1 This is a sectional view schematically showing an example of a plasma processing apparatus suitable for a film formation process according to an embodiment of the present invention.

Embodiments of the present invention will be specifically described below adequately referring to the accompanying drawings. FIG. 1 is a sectional view schematically showing an example of a plasma processing apparatus which executes a plasma processing method according to an embodiment of the present invention. This plasma processing apparatus is configured as a plasma processing apparatus of the RLSA (Radial Line Slot Antenna) microwave plasma type, which supplies microwaves into a process chamber through a planar antenna having a plurality of slots, particularly, an RLSA, to generate plasma, so that microwave plasma is generated with a high density and a low electron temperature. This plasma processing apparatus can be preferably used for processes, such as formation of a silicon oxide film, in the manufacturing process of various kinds of semiconductor devices. Formation of a silicon oxide film can include formation of a tunnel oxide film of a non-volatile memory and formation of a protective film in the manufacturing process of an imaging device, etc. in addition to formation of a gate insulating film in semiconductor devices, such as an MOS transistor, MOS-FET (Field Effect Transistor), and TFT (Thin Film Transistor), restoration oxidization of poly-silicon of the side wall of a gate electrode, and the like. This plasma processing apparatus 100 includes an essentially cylindrical chamber 1, which is airtight and grounded. The bottom wall 1a of the chamber 1 has a circular opening portion 10 formed essentially at the center, and is provided with an exhaust chamber 11 communicating with the opening portion 10 and extending downward.

The chamber 1 is provided with a susceptor 2 located therein and made of a ceramic, such as AlN, for supporting a target object, such as a wafer W, in a horizontal state. The susceptor 2 is supported by a cylindrical support member 3 made of a ceramic, such as AlN, and extending upward from the center of the bottom of the exhaust chamber 11. The susceptor 2 is provided with a guide ring 4 located on the outer edge to guide the wafer W. The susceptor 2 is further provided with a heater 5 of the resistance heating type built therein. The heater 5 is supplied with a power from a heater power supply 6 to heat the susceptor 2, thereby heating the target object or wafer W. For example, the heater 5 can control the temperature within a range of from room temperature to 800° C. A cylindrical liner 7 made of quartz is attached along the inner wall of the chamber 1. The outer periphery of the susceptor 2 is surrounded by an annular baffle plate 8, which is supported by a plurality of support members 9. The baffle plate 8 has a number of exhaust holes 8a and allows the interior of the chamber 1 to be uniformly exhausted.

The susceptor 2 is provided with wafer support pins (not shown) that can project and retreat relative to the surface of the susceptor 2 to support the wafer W and move it up and down.

A gas feed member 15 having an annular structure is provided at the sidewall of the chamber 1, and is connected to a gas supply system 16. The gas feed member may have a shower structure. The gas supply system 16 includes, for example, an Ar gas supply source 17, an $H_2$ gas supply source 18, and an $O_2$ gas supply source 19, from which gases are supplied through respective gas lines 20 to the gas feed member 15 and are delivered from the gas feed member 15 into the chamber 1. Each of the gas lines 20 is provided with a mass-flow controller 21 and switching valves 22 one on either side of the controller 21. In place of Ar gas, another rare gas, such as Kr or Xe, may be used.

The sidewall of the exhaust chamber 11 is connected to an exhaust line 23 to which an exhaust unit 24 including a high speed vacuum pump is connected. As the exhaust unit 24 is operated, the gas from inside the chamber 1 is uniformly exhausted into space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W and a dummy wafer Wd are transferred into and out of a transfer chamber (not shown) adjacent to the plasma processing apparatus 100 through the transfer port 25.

The chamber 1 has an opening portion at the top, and is provided with an annular support portion 27 along the periphery of the opening portion. A microwave transmission plate 28 is airtightly mounted on the support portion 27 through a seal member 29, and is made of a dielectric material, such as quartz or a ceramic, e.g., $Al_2O_3$ or AlN, to transmit microwaves. The interior of the chamber 1 is thus held airtight.

Figure 2:
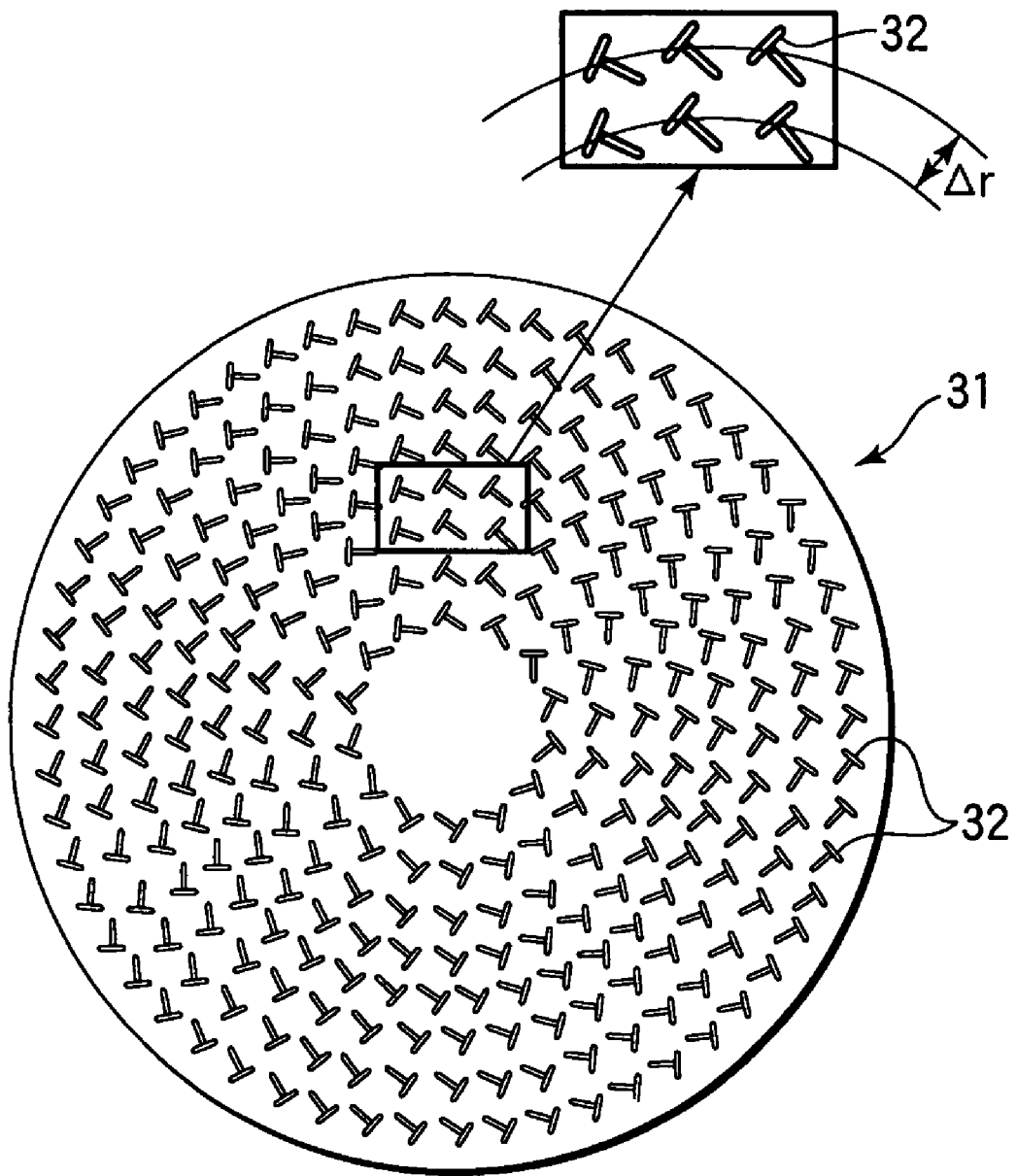
FIG. 2 This is a view showing the structure of a planar antenna member to be used in the plasma processing apparatus in FIG. 1.

A circular planar antenna member 31 is located above the microwave transmission plate 28 to face the susceptor 2. The planar antenna member 31 is fixed to the upper end of the side wall of the chamber 1. The planar antenna member 31 is formed of, e.g., a copper plate or aluminum plate with the surface plated with gold or silver. The planar antenna member 31 has a number of microwave radiation holes 32 formed therethrough and arrayed in a predetermined pattern. For example, as shown in FIG. 2, the microwave radiation holes 32 are formed of long slits, wherein the microwave radiation holes 32 are typically arranged such that adjacent holes 32 form a T-shape, while the microwave radiation holes 32 are arrayed on a plurality of concentric circles. The length and array intervals of the microwave radiation holes 32 are determined in accordance with the wavelength ($\lambda$) of microwaves. For example, the intervals of the microwave radiation holes 32 are set to be $\frac{1}{2}\lambda$ or $\lambda$. In FIG. 2, the interval between adjacent microwave radiation holes 32 respectively on two concentric circles is expressed with $\Delta r$. The microwave radiation holes 32 may have another shape, such as a circular shape or arched shape. The array pattern of the microwave radiation holes 32 is not limited to a specific one, and, for example, it may be spiral or radial other than concentric.

A wave-retardation body 33 having a dielectric constant larger than that of vacuum is provided on the top of the planar antenna member 31. The wave-retardation body 33 has a function of shortening the wavelength of microwaves to adjust plasma, because the wavelength of microwaves becomes longer in a vacuum condition. The planar antenna member 31 and the microwave transmission plate 28 are set in close contact with each other, and the wave-retardation body 33 and the planar antenna member 31 are set in close contact with each other.

A shield lid 34 made of a metal material, such as aluminum or stainless steel, is provided on the top surface of the chamber 1 to cover the planar antenna member 31 and the wave-retardation body 33. The top surface of the chamber 1 and the shield lid 34 are sealed with a seal member 35. Cooling water passages 34a are formed in the shield lid 34, so that cooling water is supplied to the cooling water passages 34a to cool the shield lid 34, the wave-retardation body 33, the planar antenna member 31, and the microwave transmission plate 28. The shield lid 34 is grounded.

Figure 3:
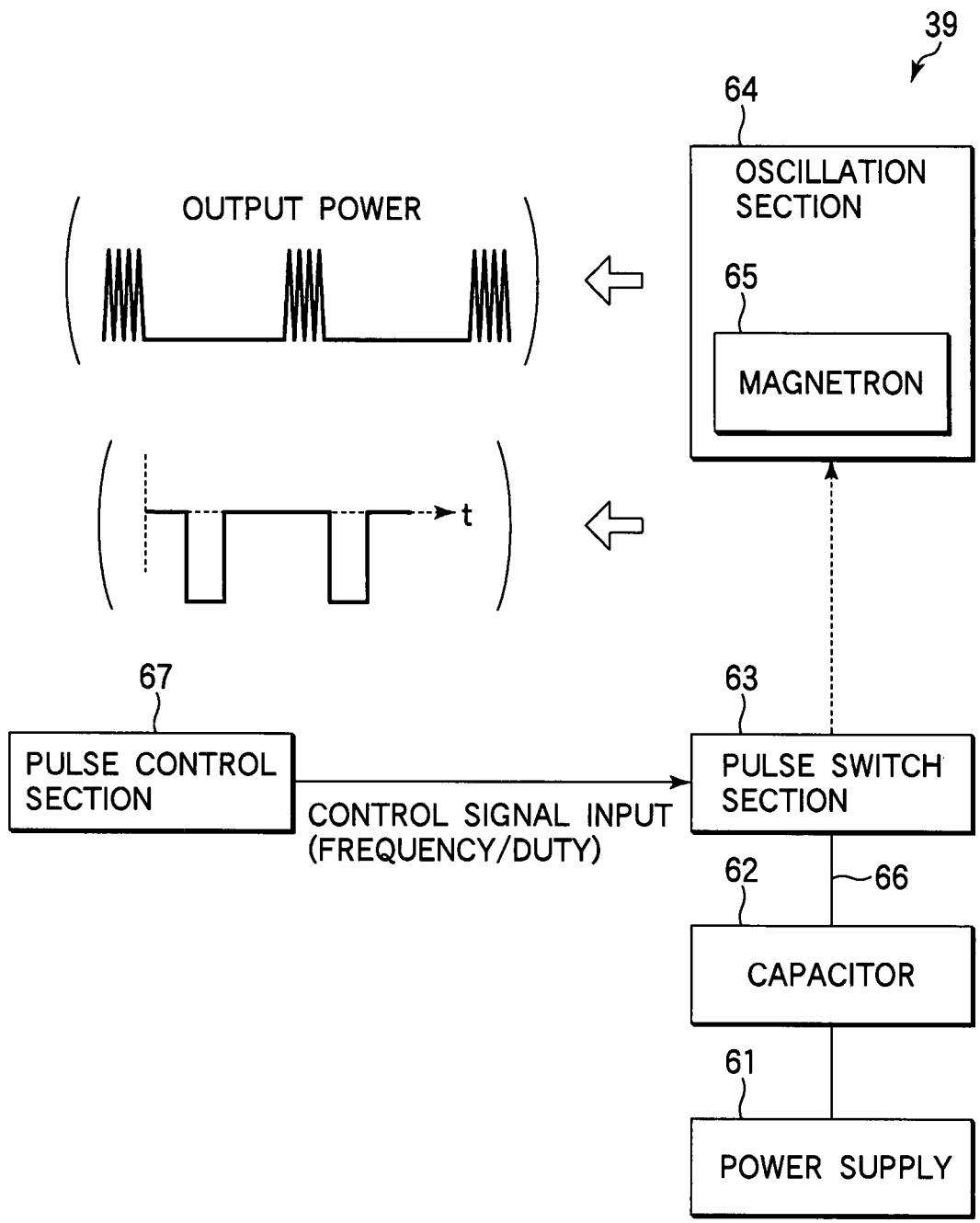
FIG. 3 This is a diagram schematically showing the structure of a microwave generation unit.

The shield lid 34 has an opening portion 36 formed at the center of the upper wall and connected to a wave guide tube 37. The wave guide tube 37 is connected to the microwave generation unit 39 at one end through a matching circuit 38. The configuration of the microwave generation unit 39 is schematically shown in FIG. 3. In the microwave generation unit 39, a capacitor 62 and a pulse switch section 63 are provided on a high-voltage supply line 66 connecting a power supply 61 to a magnetron 65 of an oscillation section 64. A pulse control section 67 is connected to the pulse switch section 63 to which control signals for, e.g., the frequency and duty ratio are input. In response to an instruction from a process controller 50 (to be described later), the pulse control section 67 outputs the control signals to the pulse switch section 63. As the control signals are input to the pulse switch section 63 while a high voltage from the power supply 61 is supplied thereto, as shown in FIG. 3, rectangular waves of a predetermined voltage (e.g., $-5.1$ [kV]) are supplied to the magnetron 65 of the oscillation section 64, and pulsated microwaves are output. The pulsated microwaves generated by the microwave generation unit 39 are transferred to the planar antenna member 31 via the wave guide tube 37. The pulse of the microwaves can be controlled to have a frequency of 1 kHz to 100 kHz, and preferably 5 kHz to 50 kHz, and a duty ratio of 10 to 90%, and preferably 50 to 90%.

The wave guide tube 37 includes a coaxial wave guide tube 37a having a circular cross-section and extending upward from the opening portion 36 of the shield lid 34, and a rectangular wave guide tube 37b connected via a mode transducer 40 to the upper end of the coaxial wave guide tube 37a and extending in a horizontal direction. The mode transducer 40 between the rectangular wave guide tube 37b and the coaxial wave guide tube 37a has a function of converting microwaves propagating in the rectangular wave guide tube 37b in a TE mode to a TEM mode. The coaxial wave guide tube 37a includes an inner conductive body 41 extending at the center, which is connected and fixed to the center of the planar antenna member 31 at the lower end. With this arrangement, pulsated microwaves are efficiently and uniformly propagated through the inner conductive body 41 of the coaxial wave guide tube 37a to the planar antenna member 31 in the radial direction.

A transparent window 200 for measuring plasma light-emission is provided at the lower portion of the side wall of the chamber 1. A light receiving portion 201 is disposed adjacent to the window 200, and is electrically connected to a spectra control unit 202, such as a monochrometer, for measuring the light-emission intensity of plasma. As the location of the window 200 is set apart from the planar antenna member 31, it is not easily influenced by the plasma, and there is less deposition to the window 200, thus making it possible to make stable measurements. The location of the spectra control unit 202 is not particularly limited, and can be any position where stable measurements can be taken. As the cylindrical liner 7 made of quartz is provided in the chamber 1, the light-emission intensity of radicals in plasma can be measured through the window 200 and cylindrical liner 7. Although an opening can be provided in the liner 7, it is preferable not to provide an opening therein, in order to prevent direct contact of plasma with the window 200 and deposition on the window 200.

The respective components of the plasma processing apparatus 100 are connected to and controlled by a process controller 50 comprising a CPU. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage portion 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

As the process controller 50 is electrically connected to the spectra control unit 202 by connection means 53, information on the light-emission intensity of OH* radicals or the like detected by the spectra control unit 202 is analyzed to control the pulse condition. As the control signals are sent to the pulse control section 67 from the process controller 50 based on the measured light-emission intensity, for example, the pulse condition, such as the pulse frequency and the duty ratio, can be changed automatically.

In the plasma processing apparatus 100 of the RLSA type thus configured, a process, such as oxidization of a silicon layer of a wafer W to form an oxide film, can be executed in the following procedures.

First, the gate valve 26 is opened, and a wafer W having a silicon layer formed thereon is transferred through the transfer port 25 into the chamber 1 and is placed on the susceptor 2. Then, an Ar gas, $H_2$ gas, and $O_2$ gas are supplied through the gas feed member 15 into the chamber 1 at predetermined flow rates from the Ar gas supply source 17, $H_2$ gas supply source 18, and $O_2$ gas supply source 19 in the gas supply system 16. Specifically, for example, the flow rate of a rare gas, such as Ar, is set to be 250 to 1,000 mL/min (sccm), the $H_2$ gas flow rate is set to be 1 to 20 mL/min (sccm), and the $O_2$ gas flow rate is set to be 1 to 20 mL/min (sccm). Further, the process pressure in the chamber is adjusted to 6.7 to 1,333 Pa (50 mTorr to 10 Torr), preferably 66.7 to 266.6 Pa (50 mTorr to 2 Torr), and desirably around 133.3 Pa, while the temperature of the wafer W is increased to 300 to 800° C., and preferably 400 to 600° C. or so. ° C.

Then, pulsated microwaves from the microwave generation unit 39 are supplied through the matching circuit 38 into the wave guide tube 37. The microwaves are supplied through the rectangular wave guide tube 37b, the mode transducer 40, and the coaxial wave guide tube 37a in order to the planar antenna member 31 via the inner conductor 41. Then, the microwaves are radiated through the slots of the planar antenna member 31 via the microwave transmission plate 28 into the space above the wafer W within the chamber 1. The microwaves are propagated in a TE mode through the rectangular wave guide tube 37b, and are then transduced from the TE mode into a TEM mode by the mode transducer 40 and propagated in the TEM mode through the coaxial wave guide tube 37a to the planar antenna member 31. An electromagnetic field is formed in the chamber 1 by the pulsated microwaves radiated from the planar antenna member 31 through the microwave transmission plate 28 into the chamber 1, thereby turning the Ar gas, $H_2$ gas, and $O_2$ gas into plasma. This microwave plasma becomes plasma maintaining a high density of about $5 \times 10^{10}$ to $1 \times 10^{13}/cm^3$, as the microwaves are radiated from a plurality of microwave radiation holes 32 of the planar antenna member 31 in a pulse (intermittent) form. Then, oxygen is introduced into silicon, thereby forming an $SiO_2$ film, by the action of an oxide species in plasma, e.g., oxygen radicals (O*), hydroxy radicals (OH*), oxygen ions ($O^2$), and so forth.

The plasma density in the plasma process of the present invention is preferably $10^9$ to $10^{13}/cm^3$. As a plasma processing apparatus capable of generating plasma of such a high density, besides the aforementioned plasma processing apparatus of the RLSA type, for example, a plasma processing apparatus of the parallel plate type, a plasma processing apparatus of the surface-wave plasma type, a plasma processing apparatus of the inductively-coupled plasma type, a plasma processing apparatus of the electron cyclotron plasma type, and the like can be used.

In the embodiment, as microwaves are generated in a pulse form, the electron temperature of plasma can be reduced to 30 to 50%. Therefore, the electron temperature of plasma in forming an oxide film using the gas type can be reduced to or below approximately 1.2 eV, and preferably 0.7 to 0.5 eV or lower.

Figure 4:
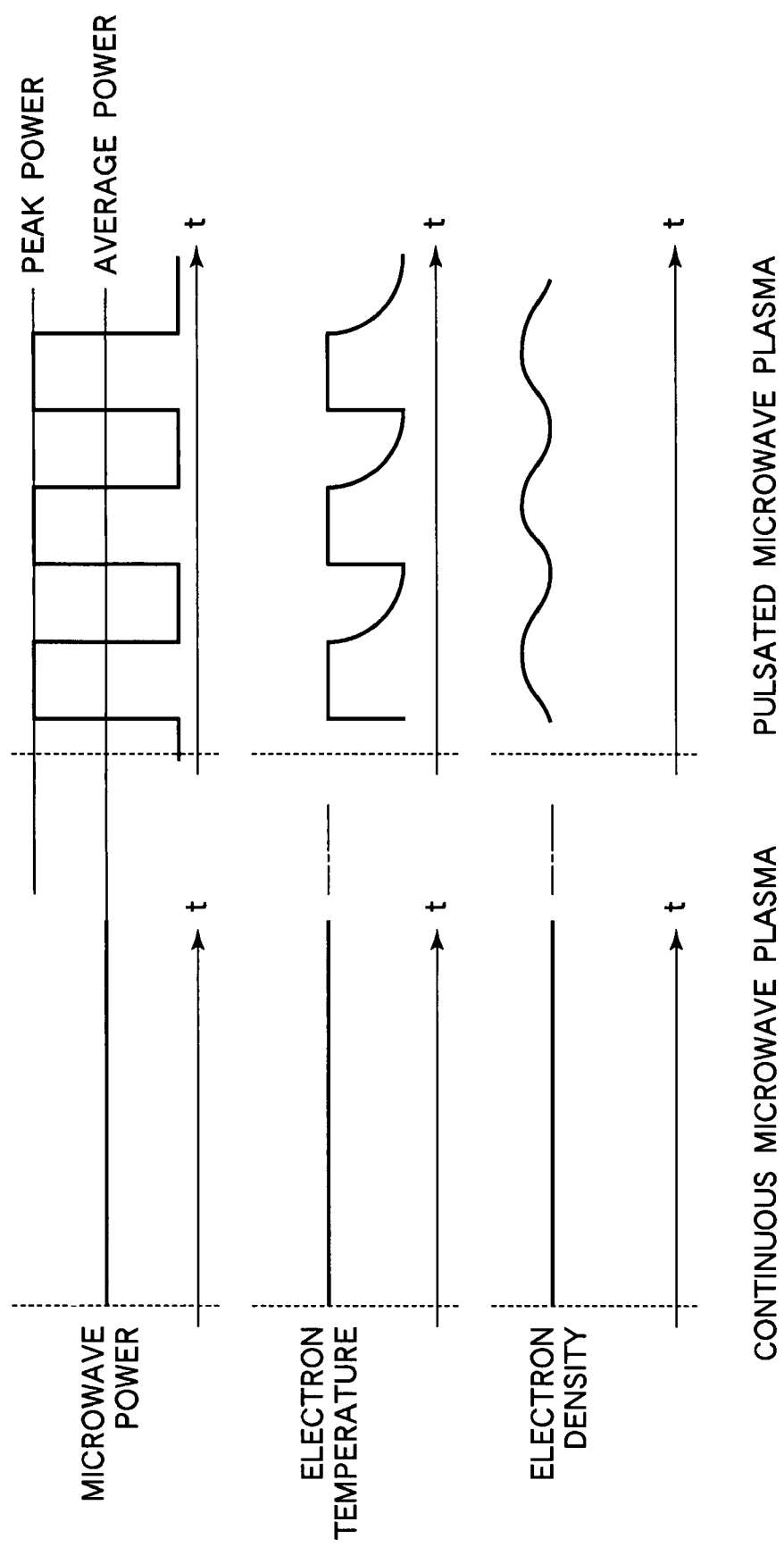
FIG. 4 This is a diagram of comparison of continuous microwave plasma with pulsated microwave plasma.

FIG. 4 is a diagram showing characteristic comparison of the power, electron temperature and electron density of continuous microwave plasma in forming plasma with those of pulsated microwave plasma in forming plasma. In the diagram, "t" represents passage of time. For pulsated microwave plasma, when the electron temperature repeats rising and falling in a given cycle, the electron temperature can be suppressed lower than that of continuous microwave plasma for the same average power. While the electron density rises and falls in a gentle cycle, it is kept nearly equal to that of continuous microwave plasma on the average, so that the oxidation rate will not be deteriorated significantly. Those characteristics of pulsated microwave plasma are experimentally confirmed. Therefore, the use of pulsated microwave plasma can form an oxide film at a low temperature and in a short period of time. When the plasma processing apparatus 100 of the RLSA type as shown in FIG. 1 is used, the electron temperature can be made lower, a plasma damage on the underlying film or the like caused by ions or the like are further reduced, so that a very mild process is realized.

In the formation of an oxide film with continuous microwave plasma, at the time of oxidation using a gas containing Ar, $H_2$, and $O_2$, a strong light-emission peak by OH* which is an oxide species in the ultraviolet region in the chamber, e.g., near 310 nm, is observed. While this OH* is essential in the formation of an oxide film, the OH* increases the interface state density (Dit: Density Interface Trap) of Si/$SiO_2$ when it is irradiated with ultraviolet rays, so that it becomes a factor to give a plasma damage on a target object, such as a wafer W, thereby decreasing the product yield. Particularly, in the manufacturing process for a semiconductor device susceptible to light, such as an image sensor, which is typified by a CCD (Charge Coupled Device), when intense plasma light-emission in the ultraviolet region, e.g., 250 to 400 nm, occurs in the process of forming an oxide film using plasma, the interface state density of $SiO_2$/Si becomes higher, resulting in an increase dark current. The dark current provides a device, such as CCD, with a large characteristic change, thereby decreasing the product yield. By way of contrast, the use of pulsated microwave plasma can significantly reduce light-emission in the ultraviolet region. In the case of using a gas containing Ar, $H_2$, and $O_2$ for example, the pulse condition is controlled such that the light-emission intensity ratio in the ultraviolet region with respect to continuous microwave plasma under the same condition is 50% or lower, and preferably 30% or lower, and the oxidation rate ratio with respect to continuous microwave plasma is 55% or higher, and preferably 70% or higher. This can suppress light-emission of OH* in the ultraviolet region while maintaining an oxidation rate at a given value or higher, and can thus reduce the plasma damage. In the case of using a gas containing Ar and $O_2$, the pulse condition is controlled such that the light-emission intensity ratio in the ultraviolet region with respect to continuous microwave plasma under the same condition is 90% or lower, and preferably 70% or lower, and the oxidation rate ratio with respect to continuous microwave plasma is 80% or higher, and preferably 90% or higher. This can suppress light-emission in the ultraviolet region while maintaining an oxidation rate at a given value or higher, and can thus reduce the plasma damage.

As the pulse condition to ensure such oxide film formation, for example, the duty ratio should be set to 50 to 90% at the pulse frequency of 1 kHz to 100 kHz, and preferably the duty ratio should be 50 to 90% at the pulse frequency of 5 kHz to 50 kHz. Therefore, the plasma processing method of the present invention is suitable in the case where silicon is oxidized to form a silicon oxide film of $SiO_2$ or the like, particularly, in the manufacturing process for an imaging device, such as CCD.

Next, an explanation will be given of results of tests performed to confirm the effects of the present invention. In the following tests, the plasma processing apparatus 100 with the same configuration as shown in FIG. 1 was used.

At the time of oxidizing the Si substrate by use of pulsated microwaves or electromagnetic waves under the following conditions to form an oxide film ($SiO_2$ film), the light-emission intensity at the wavelength of 310 nm in the chamber was measured with a monochrometer. The measurement value was compared with the corresponding measurement value obtained by a case using continuous microwaves. The results are shown in FIG. 5.

<Conditions>
Ar/$H_2$/$O_2$ flow rate ratio=500/5/5 mL/min (sccm);
Pressure in the chamber=133.3 Pa;
Microwave power=2,750 W;
Temperature of wafer W=500° C.;
Pulsated microwave plasma 1: frequency=50 kHz, duty ratio=50%;
Pulsated microwave plasma 2: frequency=50 kHz, duty ratio=50%;
Continuous microwave plasma: frequency=2.45 GHz.

Figure 5:
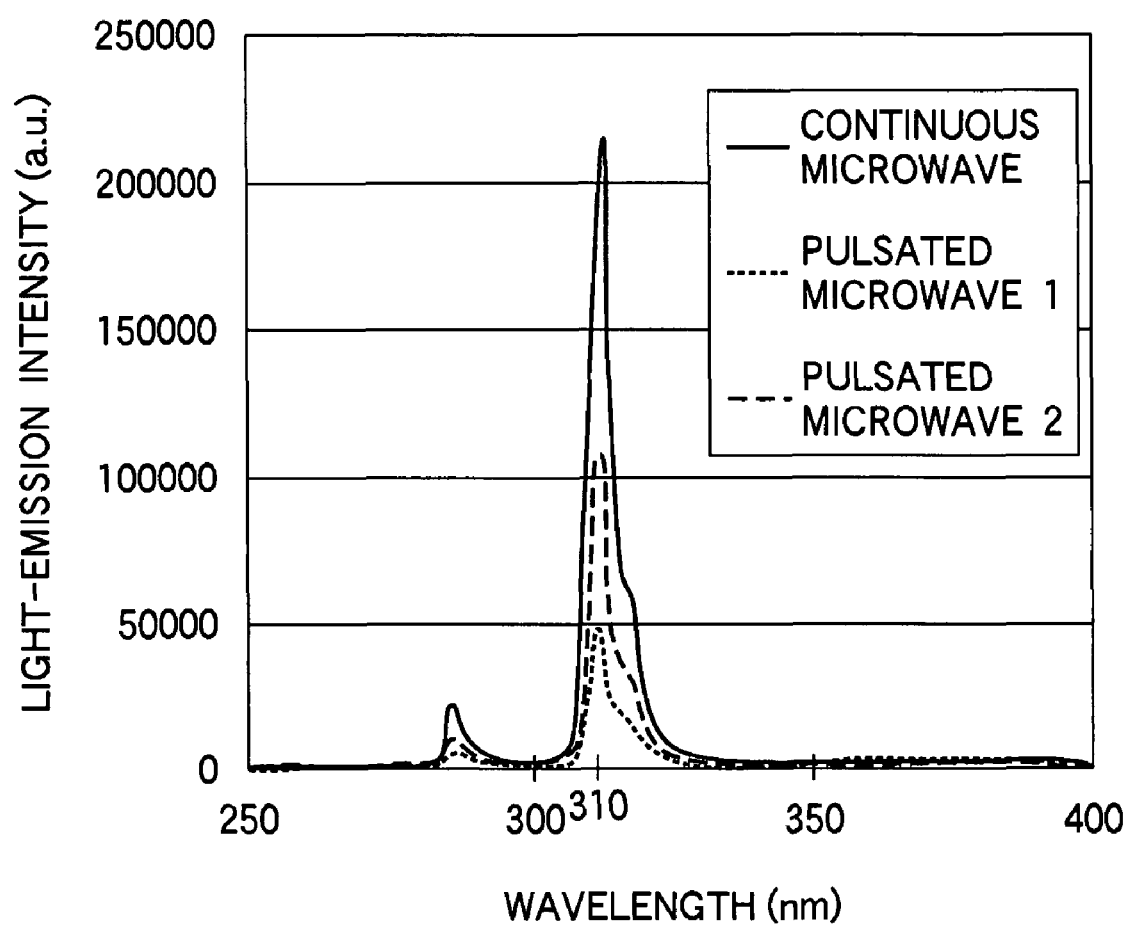
FIG. 5 This is a graph diagram showing the light-emission intensity of 310 nm in plasma.

It was confirmed from FIG. 5 that in the case of pulsated microwave plasma, the light-emission peak of 310 nm of OH radicals (OH*) was reduced considerably. It appears that the light-emission of the OH* is a cause for a plasma damage which degrades the quality of the oxide film to be formed. According to the present invention, silicon is oxidized by pulsated microwave plasma using the same plasma processing apparatus 100 as shown in FIG. 1 to suppress plasma light-emission in the ultraviolet region. This makes it possible to form an oxide film while reducing the adverse effect on a target object as much as possible.

Figure 6:
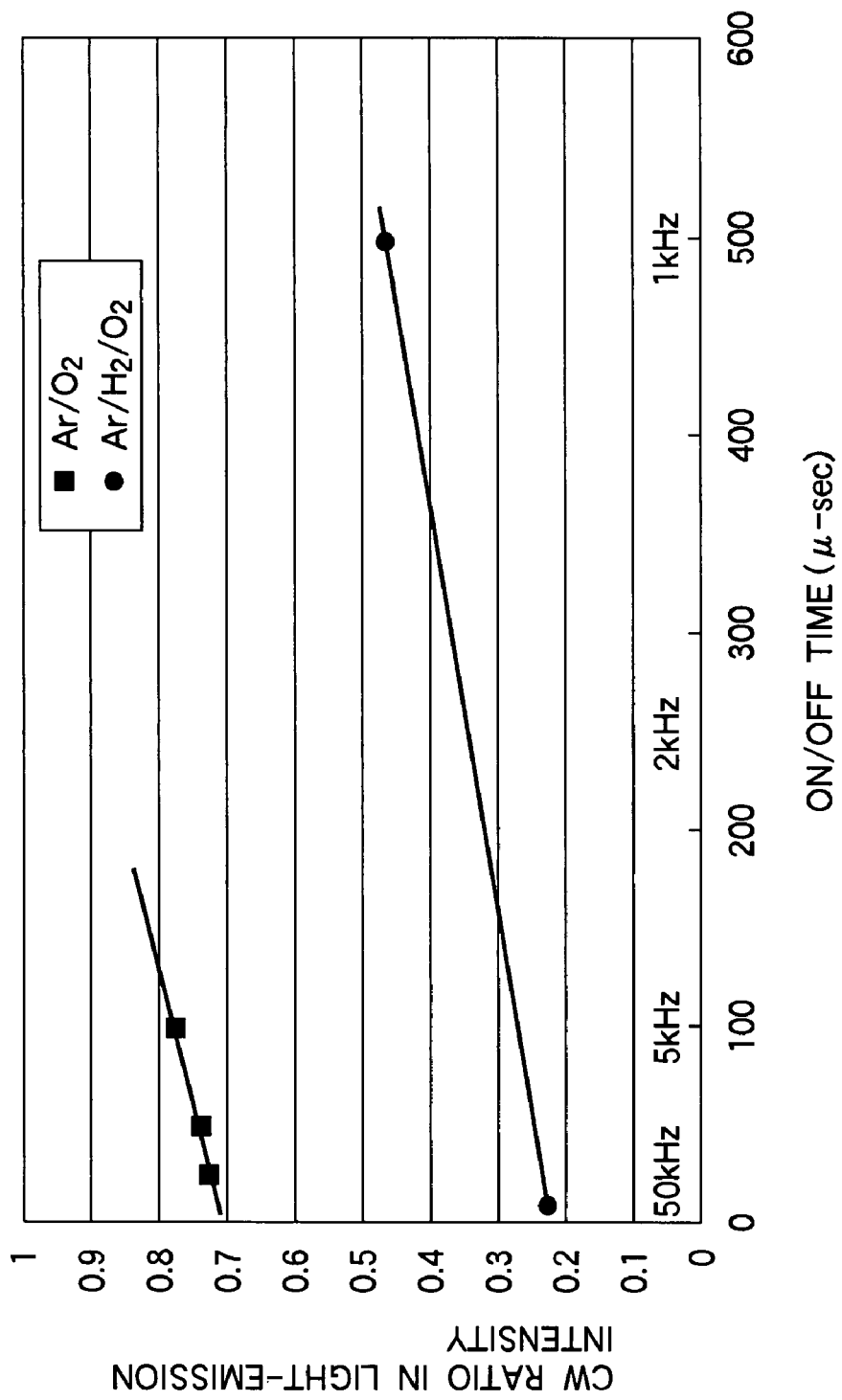
FIG. 6 This is a graph diagram showing the relationship between the pulse frequency of pulsated microwaves and the light-emission intensity ratio.

FIG. 6 shows the results of studying the relationship between the pulse frequency of pulsated microwaves and the light-emission intensity. The ordinate in FIG. 6 represents the light-emission intensity of OH* of 310 nm in pulsated microwave plasma in terms of a ratio with respect to continuous waves CW, and the abscissa represents the ON/OFF time (μ-sec) of the pulse. Ar/$H_2$/$O_2$ and Ar/$O_2$ were used as process gases. The following are the process conditions.

<Conditions>
(1) Ar/$H_2$/$O_2$
Flow rate ratio=500/5/5 mL/min (sccm);
Pressure in the chamber=133.3 Pa;
Microwave power=2,750 W;
Temperature of wafer W=500° C.;
Pulse frequency=1 kHz or 50 kHz (duty ratio=50% in either case).
(2) Ar/$O_2$
Flow rate ratio=500/5 mL/min (sccm);
Pressure in the chamber=133.3 Pa;
Microwave power=2,750 W;
Temperature of wafer W=500° C.;
Pulse frequency=5 kHz, 30 kHz or 50 kHz (duty ratio=50% in each case).
(3) Continuous microwave plasma: the same conditions except that the frequency=2.45 GHz for the two gas types.

It is understood from FIG. 6 that with either the Ar/$H_2$/$O_2$ gas type or the Ar/$O_2$ gas type, increasing the pulse frequency reduced the ratio of the light-emission intensity with respect to continuous waves, resulting in a large light-emission intensity reducing effect. It was shown that in the case of Ar/$H_2$/$O_2$ which would bring about a particularly large light-emission intensity of OH*, as compared with Ar/$O_2$, the effect of reducing the light-emission intensity of OH* with respect to continuous waves was remarkably large.

Light-emission of plasma in the ultraviolet region adversely influences an oxide film. While the intense light-emission of OH* seems to be a cause for the influence, suppressing light-emission of OH* which itself is an active species having a strong oxidation action reduces OH* in plasma, leading to reduction in oxidation rate. In this respect, the relationship between the pulse frequency of pulsated microwaves and the thickness of an oxide film (plasma oxidation rate) in forming the oxide film on the Si substrate was studied. The following are the process conditions of the oxidization process. The thickness of the oxide film was measured by an ellipsometer as an optical film thickness measuring unit.

<Oxidization Conditions>
(1) Ar/$H_2$/$O_2$
Flow rate ratio=500/5/5 mL/min (sccm);
Pressure in the chamber=133.3 Pa;
Microwave power=2,750 W;
Temperature of wafer W=500° C.;
Pulse frequency=varied in the range of 1 kHz to 50 kHz (duty ratio=50% in each case);
Process time=180 seconds.
(2) Ar/$O_2$
Flow rate ratio=500/5 mL/min (sccm);
Pressure in the chamber=133.3 Pa;
Microwave power=2,750 W;
Temperature of wafer W=500° C.;
Pulse frequency=varied in the range of 1 kHz to 50 kHz (duty ratio=50% in each case);
Process time=180 seconds.
(3) Continuous microwave plasma: the same conditions except that the frequency=2.45 GHz for the two gas types.

Figure 7:
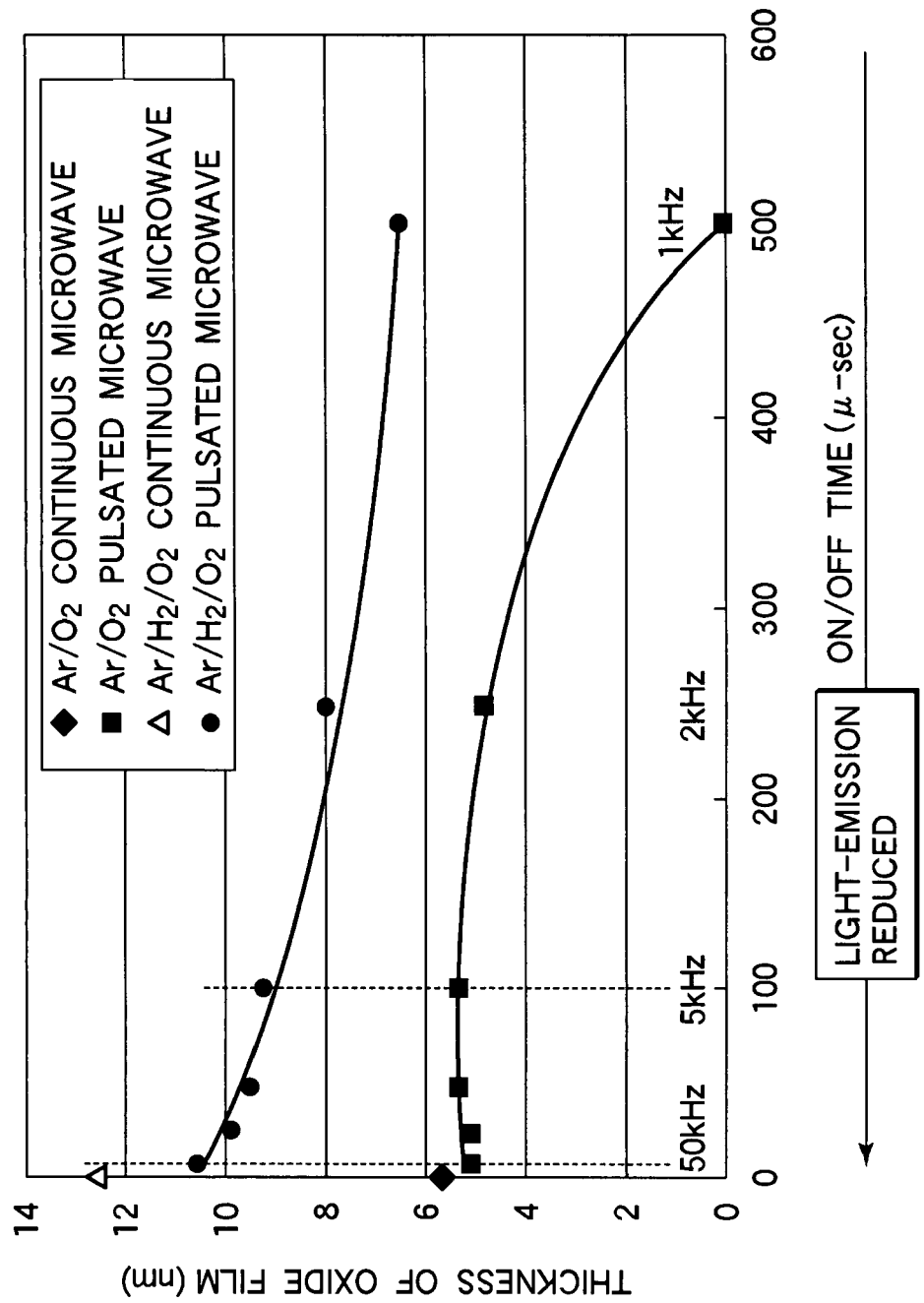
FIG. 7 This is a graph diagram showing the relationship between the pulse frequency of pulsated microwaves and the thickness of an oxide film.

The results are shown in FIG. 7. It is apparent from FIG. 7 that the oxidation rate was higher for Ar/$H_2$/$O_2$ than for Ar/$O_2$. As the ON/OFF time increased, i.e., as the pulse frequency became lower, the oxidation rate tended to become lower. However, it is understood that a practically sufficient oxidation rate was acquired for the pulse frequency ranging from 1 kHz to 50 kHz.

In the case of Ar/O$_2$, the oxidation rate was constant for the pulse frequency ranging from 2 kHz to 50 kHz in which range the reduction in oxidation rate with respect to continuous waves was small, whereas the oxidation rate decreased for the pulse frequency of 2 kHz or lower. This seems to show that in either gas type of Ar/H$_2$/O$_2$ or Ar/O$_2$, the preferable range of the pulse frequency is 5 kHz to 50 kHz for the duty ratio=50% from the view point of reducing the light-emission intensity of OH* while maintaining the oxidation rate.

Next, the ratio of the oxidation rate by continuous microwave plasma to the oxidation rate by pulsated microwave plasma and the ratio of the light-emission intensity (wavelength of 310 nm) of OH* by continuous microwave plasma to the light-emission intensity (same wavelength) of OH* by pulsated microwave plasma, each measured under the following conditions, were acquired.

<Common Conditions>
Ar/H$_2$/O$_2$ flow rate ratio=500/5/5 mL/min (sccm);
Pressure in the chamber=about 133.3 Pa (1 Torr);
Wafer temperature=500° C.;
Process time; 180 seconds.
Continuous Microwave Plasma:
Frequency=2.45 GHz.
Pulsated Microwave Plasma:
(Condition A-1) pulse on (ON) time of 100 μ-sec, peak microwave power of 2,750 W;
(Condition A-2) pulse on (ON) time of 50 μ-sec, peak microwave power of 2,750 W;
(Condition A-3) pulse on (ON) time of 10 μ-sec, peak microwave power of 2,750 W;
(Condition A-4) frequency of 5 kHz, duty ratio of 50%, peak microwave power of 2,750 W;
(Condition A-5) frequency of 50 kHz, duty ratio of 50%, peak microwave power of 2,750 W.

Figure 8:
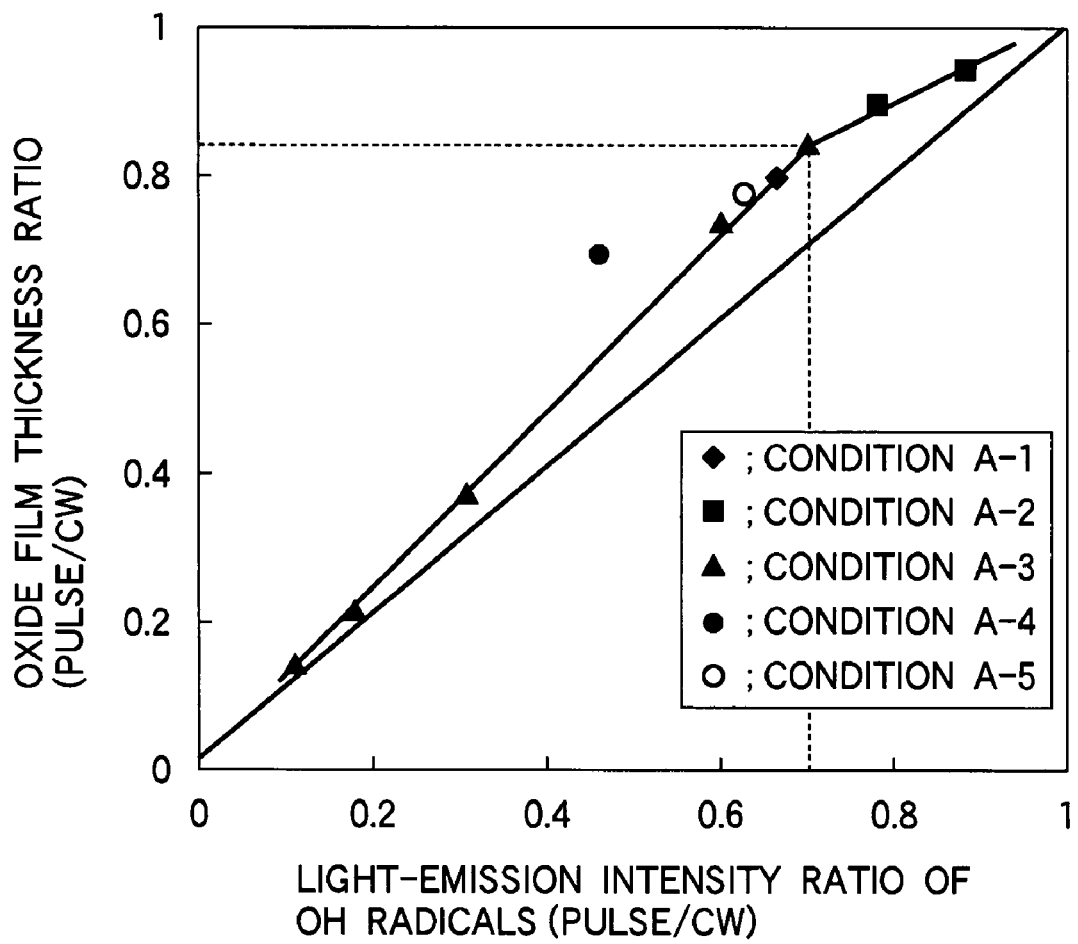
FIG. 8 This is a graph diagram of the plotted relationship between the light-emission intensity ratio of pulsated microwave plasma vs. continuous microwave plasma, and the thickness of an oxide film.

The results are shown in FIG. 8. It is apparent from the results that the pulse condition range, where the light-emission intensity can be reduced while maintaining the oxidation rate, is exemplified by the pulse on (ON) time of 10 to 100 μ-sec, and preferably 50 to 100 μ-sec, the pulse frequency of 1 kHz to 50 kHz, and preferably 5 kHz to 50 kHz, and the duty ratio of 50 to 90%, and preferably 50 to 70%. Within this range, the oxidation rate of 80% or higher of that of continuous microwave plasma can be kept while reducing the light-emission intensity of OH* radicals to 60% or so of that of continuous microwave plasma. It is therefore possible to cancel the influence of light-emission in the ultraviolet region on the target object without significantly reducing the oxidation rate, thereby improving the product yield. It is therefore very effective to perform a plasma process with pulsated microwave plasma in the formation of an oxide film in the process of manufacturing an imaging device, such as a CCD sensor or CMOS sensor, specifically, in the case of formation of a silicon oxide film as a protective film for a photoelectric converting section.

Figure 9:
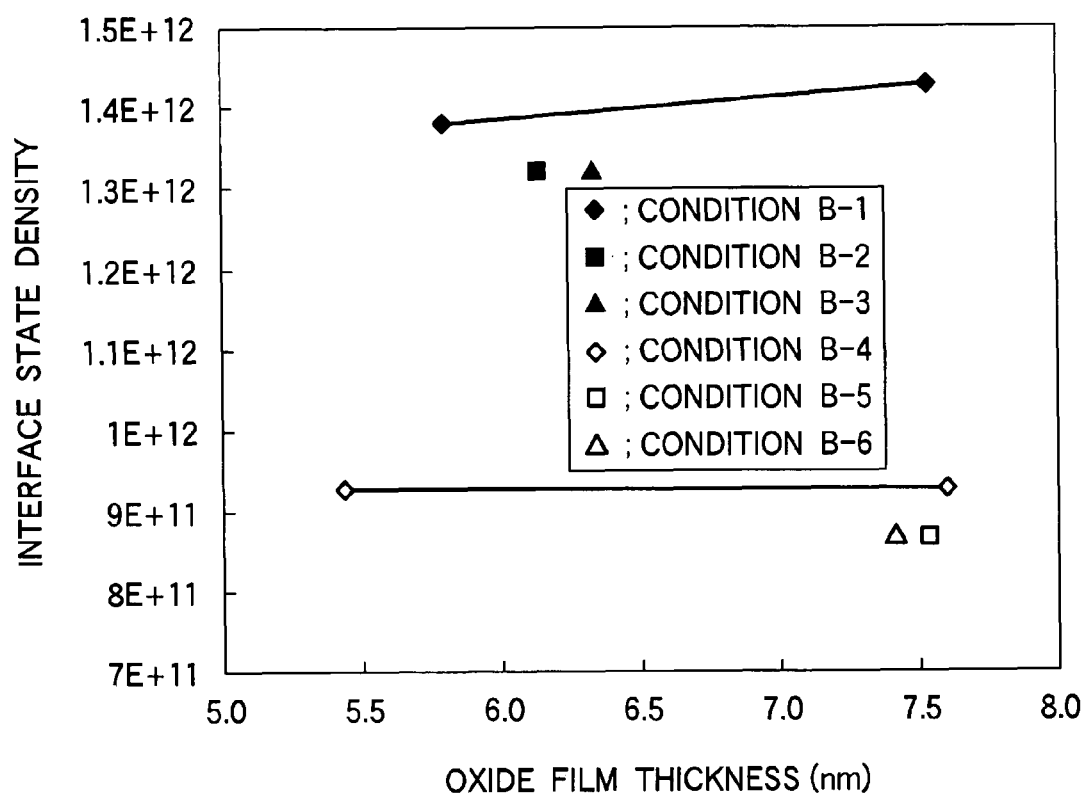
FIG. 9 This is a graph diagram showing the relationship between an interface state density and the thickness of an oxide film.

Next, the electric characteristics of an oxide film formed with pulsated microwave plasma were evaluated. Silicon oxidization with pulsated microwave plasma or continuous microwave plasma was performed under the following conditions, and the relationship between the thickness of the oxide film and the interface state density was studied. The results are shown in FIG. 9.

<Common Conditions>
Pressure in the chamber=about 133.3 Pa (1 Torr);
Microwave power=2,750 W;
Wafer temperature=500° C.;
Process time; 180 seconds.
(Condition B-1) Continuous microwave plasma:
Ar/O$_2$ flow rate ratio=500/5 mL/min (sccm).
(Condition B-2) Pulsated microwave plasma:
Frequency of 5 kHz, duty ratio of 50%;
Ar/O$_2$ flow rate ratio=500/5 mL/min (sccm).
(Condition B-3) Pulsated microwave plasma:
Frequency of 50 kHz, duty ratio of 50%;
Ar/O$_2$ flow rate ratio=500/5 mL/min (sccm).
(Condition B-4) Continuous microwave plasma:
Ar/H$_2$/O$_2$ flow rate ratio=500/5/5 mL/min (sccm).
(Condition B-5) Pulsated microwave plasma:
Frequency of 5 kHz, duty ratio of 50%;
Ar/H$_2$/O$_2$ flow rate ratio=500/5/5 mL/min (sccm).
(Condition B-6) Pulsated microwave plasma:
Frequency of 50 kHz, duty ratio of 50%;
Ar/H$_2$/O$_2$ flow rate ratio=500/5/5 mL/min (sccm).

In general, it is said that the dark current increases to bring about an imaging failure unless the interface state density of Si/SiO$_2$ of an imaging device is $1\times10^{12}$ or lower. It was however confirmed from FIG. 9 that the oxide film formed with pulsated microwave plasma had a lower interface state density and a higher denseness than the oxide film formed with continuous microwave plasma, and thus had excellent electric characteristics. In the case of the process with the gas type (Ar/H$_2$/O$_2$) containing hydrogen by a predetermined ratio, particularly, it was confirmed that the interface state density was equal to or less than $1\times10^{12}$, which would not influence the imaging device.

It was shown that the oxide film formed with pulsated microwave plasma had a lower interface state density which would be increased by ultraviolet rays than the oxide film formed with continuous microwave plasma, so that it could be used suitably in the formation of an oxide film in the process of manufacturing an imaging device, such as a CCD sensor or CMOS sensor.

The above described results show that as the plasma processing apparatus 100 generates plasma with pulsated microwaves, it is possible to stabilize the oxidation rate and form an oxide film while keeping a practically sufficient oxidation rate. It is further shown that the use of pulsated microwaves can reduce intense light-emission in the ultraviolet region. This can reduce plasma damage, and reduce electric characteristics of an oxide film to be obtained, particularly, the interface state density.

Further, it is effective to perform a process, such as plasma oxidization, by controlling light-emission in the ultraviolet region by monitoring the light-emission intensity in the ultraviolet region of plasma through the window 200 of the chamber 1 of the plasma processing apparatus 100 shown in FIG. 1 with the spectra control unit 202, and changing the pulse condition according to the monitoring result.

The present invention has been described with reference to the embodiment, but the present invention is not limited to the embodiment described above, and it may be modified in various manners.

For example, in FIG. 1, the plasma processing apparatus 100 of the RLSA type is shown as an example. However, the plasma processing apparatus is not particularly limited as long as the apparatus is a plasma processing apparatus which uses high-density plasma, microwave plasma, reflection-wave plasma, inductively-coupled plasma or the like, and the present invention can be adapted to such an apparatus as well.

A target object is not limited to a silicon substrate, and the present invention is applicable to substrates, such as an LCD substrate and a compound semiconductor substrate.

INDUSTRIAL APPLICABILITY

The present invention can be preferably utilized for formation of a silicon oxide film in the manufacturing process for various semiconductor devices.

The invention claimed is:

1. A plasma processing method, comprising:
supplying a process gas into a process chamber of a plasma processing apparatus, which accommodates a target object including a silicon surface;
supplying electromagnetic waves into the process chamber to generate plasma of the process gas; and
oxidizing the silicon surface by action of the plasma to form a silicon oxide film on the silicon surface,
wherein the process gas consists essentially of Ar gas, $H_2$ gas, and $O_2$ gas with a flow rate of the Ar gas set within a range of 250 to 1000 mL/min, a flow rate of the $H_2$ gas set within a range of 1 to 20 mL/min, and a flow rate of the $O_2$ gas set within a range of 1 to 20 mL/min,
wherein the oxidizing the silicon surface is performed under a process temperature of 300 to 800° C. and a process pressure of 66.7 to 266.6 Pa,
wherein the electromagnetic waves are pulsated electromagnetic waves with a pulse-on-time of 10 to 100 μs, a pulse frequency of 1 to 100 kHz, and a duty ratio of 50 to 90%, so as to attain a state where a light-emission intensity of OH radicals in the plasma generated by the pulsated electromagnetic waves in an ultraviolet region, at 310 nm, is equal to or lower than 50% of a corresponding light-emission intensity of plasma generated by continuous electromagnetic waves, and
wherein a silicon oxidation rate of the plasma generated by the pulsated electromagnetic waves is equal to or higher than 55% of a silicon oxidation rate of the plasma generated by the continuous electromagnetic waves.

2. The plasma processing method according to claim 1, wherein the electromagnetic waves are microwaves supplied into the process chamber from a plurality of slots formed in a planar antenna.

3. The plasma processing method according to claim 1, wherein the pulsated electromagnetic waves have a frequency of 5 to 50 kHz.

4. The plasma processing method according to claim 3, wherein the pulsated electromagnetic waves have a pulse-on-time of 50 to 100 μs and a duty ratio of 50 to 70%.

5. A plasma processing method, comprising:
supplying a process gas into a process chamber of a plasma processing apparatus, which accommodates a target object including a silicon surface;
supplying electromagnetic waves into the process chamber to generate plasma of the process gas; and
oxidizing the silicon surface by action of the plasma to form a silicon oxide film on the silicon surface,
wherein the process gas consists essentially of Ar gas and $O_2$ gas with a flow rate of the Ar gas set within a range of 250 to 1000 mL/min, and a flow rate of the $O_2$ gas set within a range of 1 to 20 mL/min,
wherein the oxidizing the silicon surface is performed under a process temperature of 300 to 800° C. and a process pressure of 66.7 to 266.6 Pa,
wherein the electromagnetic waves are pulsated electromagnetic waves with a pulse-on-time of 10 to 100 μs, a pulse frequency of 1 to 100 kHz, and a duty ratio of 50 to 90%, so as to attain a state where a light-emission intensity of OH radicals in the plasma generated by the pulsated electromagnetic waves in an ultraviolet region, at 310 nm, is equal to or lower than 90% of a corresponding light-emission intensity of plasma generated by continuous electromagnetic waves, and
wherein a silicon oxidation rate of the plasma generated by the pulsated electromagnetic waves is equal to or higher than 80% of a silicon oxidation rate of the plasma generated by the continuous electromagnetic waves.

6. The plasma processing method according to claim 5, wherein the pulsated electromagnetic waves have a frequency of 5 to 50 kHz.

7. The plasma processing method according to claim 5, wherein the electromagnetic waves are microwaves supplied into the process chamber from a plurality of slots formed in a planar antenna.

8. The plasma processing method according to claim 6, wherein the pulsated electromagnetic waves have a pulse-on-time of 50 to 100 μs and a duty ratio of 50 to 70%.

9. A plasma processing method, comprising;
supplying a process gas into a process chamber of a plasma processing apparatus, which accommodates a target object including a silicon surface;
supplying pulsated electromagnetic waves into the process chamber to generate plasma of the process gas;
oxidizing the silicon surface by action of the plasma to form a silicon oxide film on the silicon surface; and
using one or more conditions of the pulsated electromagnetic waves, selected from the group consisting of a pulse-on-time, a pulse frequency, and a duty ratio, as parameters to set, at a certain value, a light-emission intensity of OH radicals in the plasma generated by the pulsated electromagnetic waves in an ultraviolet region, at 310 nm.

10. The plasma processing method according to claim 9, further comprising:
measuring the light-emission intensity of the plasma in the process chamber; and
controlling the light-emission intensity by changing the one or more conditions in accordance with a measured value of the light-emission intensity, while processing the target object.

11. The plasma processing method according to claim 9, wherein the electromagnetic waves are microwaves supplied into the process chamber from a plurality of slots formed in a planar antenna.

12. The plasma processing method according to claim 9, wherein the pulsated electromagnetic waves have a frequency of 5 to 50 KHz.

13. The plasma processing method according to claim 9, wherein the process gas consists essentially of Ar gas, $H_2$ gas, and $O_2$ gas with a flow rate of the Ar gas set within a range of 250 to 1,000 mL/min, a flow rate of the $H_2$ gas set within a range of 1 to 20 mL/min, and a flow rate of the $O_2$ gas set within a range of 1 to 20 mL/min, and
wherein the oxidizing the silicon surface is arranged to attain a state where the certain value is equal to or lower than 50% of a corresponding light-emission intensity of plasma generated by continuous electromagnetic waves, and a silicon oxidation rate of the plasma generated by the pulsated electromagnetic waves is equal to or higher than 55% of a silicon oxidation rate of the plasma generated by the continuous electromagnetic waves.

14. The plasma processing method according to claim 9, wherein the process gas consists essentially of Ar gas and $O_2$ gas with a flow rate of the Ar gas set within a range of 250 to 1,000 mL/min and a flow rate of the $O_2$ gas set within a range of 1 to 20 mL/min, and wherein the oxidizing the silicon surface is arranged to attain a state where the certain value is equal to or lower than 90% of a corresponding light-emission intensity of plasma generated by continuous electromagnetic waves, and a silicon oxidation rate of the plasma generated by the pulsated electromagnetic waves is equal to or higher than 80% of a silicon oxidation rate of the plasma generated by the continuous electromagnetic waves.

* * * * *